US005268964A

United States Patent [19]

Watts

[11] Patent Number: 5,268,964

[45] Date of Patent: Dec. 7, 1993

[54] ADJUSTING THE LEVEL OF AN AUDIO SIGNAL

[75] Inventor: Graham Watts, Gloucestershire, England

[73] Assignee: Solid State Logic Limited, Oxfordshire, Great Britain

[21] Appl. No.: 930,661

[22] PCT Filed: Jan. 30, 1992

[86] PCT No.: PCT/GB92/00174

§ 371 Date: Oct. 2, 1992

§ 102(e) Date: Oct. 2, 1992

[87] PCT Pub. No.: WO89/01725

PCT Pub. Date: Feb. 23, 1989

[30] Foreign Application Priority Data

Feb. 2, 1991 [GB] United Kingdom ................ 9102263

[51] Int. Cl.[5] ........................................ H03G 3/00

[52] U.S. Cl. .................................. 381/107; 381/119

[58] Field of Search ...................... 381/104, 107, 119

[56] References Cited

U.S. PATENT DOCUMENTS 4,402,246 9/1983 Sekiguchi ............................ 84/345
4,792,974 12/1988 Chace .................................. 381/17
5,054,077 10/1991 Suzuki ................................ 381/119

FOREIGN PATENT DOCUMENTS 8901725 2/1989 European Pat. Off. .
2589664 10/1985 France .

OTHER PUBLICATIONS

*Patent Abstracts of Japan,* vol. 006, No. 99, 8 Jun. 1982, & JP,A,57 031 269 19 Feb. 1982 (Abstract).

*Fernseh Und Kino Technik,* vol. 37, No. 3, Mar. 1983, pp. 109-112, Picklapp: "Kommerzielles digitales Tonimschpult", p. 110, right column, last paragraph.

*Primary Examiner*—Forester W. Isen

*Attorney, Agent, or Firm*—Nixon & Vanderhye

[57] ABSTRACT

A system is disclosed for controlling the output level of an audio signal, in which a voltage controlled amplifier (18) is provided in addition to a high fidelity motorized fader (17). During normal (first mode) operation, the level of the audio signal is controlled directly by said fader, which may be adjusted in response to data from a storage device (23). On selecting a second mode of operation, the level of the audio signal is controlled by means of the voltage controlled amplifier, arranged to receive said stored data. In addition, said amplifier also receives trimming signals from said manually adjustable fader and movements of said fader in this mode are also stored, so that said modified data may be combined with the original data, to produce new data for use in said first mode of operation. The invention provides "trim mode" while providing a high fidelity resistive fader for normal operation.

12 Claims, 2 Drawing Sheets

ADJUSTING THE LEVEL OF AN AUDIO SIGNAL

FIELD OF THE INVENTION

The present invention relates to a method and an apparatus for adjusting the level of an audio signal. In particular, the invention relates to a method and apparatus for adjusting said level by means of a resistive control element.

BACKGROUND OF THE INVENTION

The adjustment of the level of an audio signal is one of the most fundamental operations performed by audio signal processing equipment. In professional audio mixing equipment, for example, adjustments to signal level are made prior to an audio event and said adjustments are also implemented during the audio event itself, consequently, the process of mixing audio signals has become a specialised occupation in itself.

In a very basic mixing apparatus, a mixing desk operator may prepare a schedule of mixing operations required during the audio event from which he, possibly with help from assistants, follows during the event, making manual adjustments where necessary. Audio mixing involves the process of taking a plurality of audio input signals, processing each signal individually, which may involve filtering or other processing, to obtain the required tonality and mixing the signals together to create one or more outputs, such as a pair of stereo outputs.

The processing circuitry present for each audio input signal is commonly referred to as a channel and in recent years the number of channels provided by mixing consoles has increased significantly, it not being uncommon to find consoles with capacity for sixty four channels.

As far as an operator is concerned, adjustments to audio level are effected by the manual operation of a linearly moveable device, known in the art as a fader. In known audio mixing systems, the fader moves an electrical contact over a resistive track, thereby variably attenuating the audio signal. Furthermore, faders are known in which an additional track is provided from which data may be obtained defining the position of the fader during an audio event. This data may be recorded and then used to automatically control the position of the fader during an automated playback. Thus, faders arranged to operate in this manner are also provided with a motor for effecting automated movement of the fader and are generally referred to as motorised faders.

The availability of improved analogue integrated circuitry led to the development of mixing equipment in which the level of an audio signal could be controlled in response to stored data by means of a voltage controlled amplifier. Furthermore, the provision of such devices made the manual operation of the fader redundant, once gain control had been taken over by the aforesaid variable gain device, operating under the control of a computer. Thus, under computer control, audio level could be adjusted automatically in response to the stored data, irrespective of the position of the manually adjustable fader, which would remain stationery. The availability of the fader during automated playback led to the development of a system in which the fader could be used to make minor adjustments to the channel level during automated playback, thus allowing the operator to improve the quality of the stored data. This facility was provided on equipment manufactured by the present applicant and has been identified by the trade mark "trim mode".

Although providing additional facilities to the engineer, the introduction of automated control via variable gain devices also introduced disadvantages, when compared with the previously known approach of using the fader itself to manually adjust audio levels. Primarily, there has been a move to reduce signal degradation introduced by the audio signal path, which in turn has led to a movement away from active gain control devices, such as voltage control amplifiers and a return to the more traditional techniques using simple variable resistive elements. In addition, operators prefer to see the link between fader movement and audio level maintained, such that a variation in audio level is always associated with a movement of its respective fader. Thus, this movement may be achieved by initial manual operation of the fader or by automated control of the fader via its motorised elements.

Thus, to achieve automated audio level variations in a system using the resistive elements, it is necessary to automatically move the fader during automated playback. However, given that the fader is being driven by stored data and the audio signal itself continues to pass through the audio track associated with the fader, all gain variations must be effected by the fader and, consequently, the fader is no longer available to effect "trim mode". Such a restraint is commonly identified by referring to the loss in the fader, that is the attenuation applied to the audio signal passing therethrough, as being absolute.

An improved system is shown in Japanese patent JP-A-60061902 in which an automatically controlled motorised fader is driven in response to stored data. During the operation of the fader in this mode, further manual adjustment may be effected because, on touching the fader, the fader itself disconnects the motor and any further movements made manually by the fader result in new data being recorded. Thus, on the next cycle, the new data is used to control the automatic movement of the fader. However, in such a system, the relationship between fader movement and audio attenuation still remains absolute and the system is not as versatile as the previously used systems with variable gain control.

SUMMARY OF THE INVENTION

It is an object of the present invention to provide an improved method and apparatus for controlling the level of an audio signal. In particular, it is an object of the present invention to provide "trim mode" operation in an audio system employing motorised faders to effect control of the audio levels.

According to a first aspect of the present invention, there is provided a method of controlling the output level of an audio signal comprising the steps of: supplying an audio input signal through a resistive control element; manually adjusting the resistance of said control element over the duration of an audio event; recording data indicative of said adjustment; repeating said audio event, while automatically adjusting the resistance of said control element in response to said data; selecting an alternative mode of operation, in which said input signal is supplied to a variable gain device; adjusting the gain of said device in response to said data and, simultaneously, adjusting the gain of said device in response to manual adjustments of said control element.

In a preferred embodiment, variations in the gain of said variable gain device in said second mode are arranged to provide a substantially similar response to resistance adjustments in said first mode. Thus, in said second mode the relationship between fader movement and signal attentuation may remain absolute. In an alternative embodiment, variations in the gain of said variable gain device in said second mode provide a different response to resistive adjustments in said first mode. Preferably, variations in gain during the second mode facilitate incremental adjustment in which the full movement of said control element in the second mode is equivalent to only a portion of irs movement in the first mode of operation. Thus, while providing the advantage of low noise performance during the first mode of operation, the incremental mode of operation is available in said second mode, in which the relationship between manual operation of the fader in the second mode is no longer absolute in relation to the level of signal degredation provided in the first mode. Thus, fine "trimming" of the fader position may be achieved during the second mode of operation, in such a way that the fine adjustments result in 0 data which is stored for later reproduction in the high fidelity first mode of operation.

According to a second aspect of the present invention, there is provided an apparatus for controlling the output level of an audio signal, comprising: a resistive control element; means for manually adjusting said control element and driven means for adjusting said element; means for recording position data indicative of manually selected positions of said element; variable gain means for controlling the output level of the audio signal, on selection of a second mode of operation, in response to said position data; means for simultaneously controlling said variable gain means in response to manual operation of said element; and means for recording position data indicative of the position of said manual element during said second mode of operation.

DETAILED DESCRIPTION OF THE PREFERRED EMBODIMENT

Figure 1:
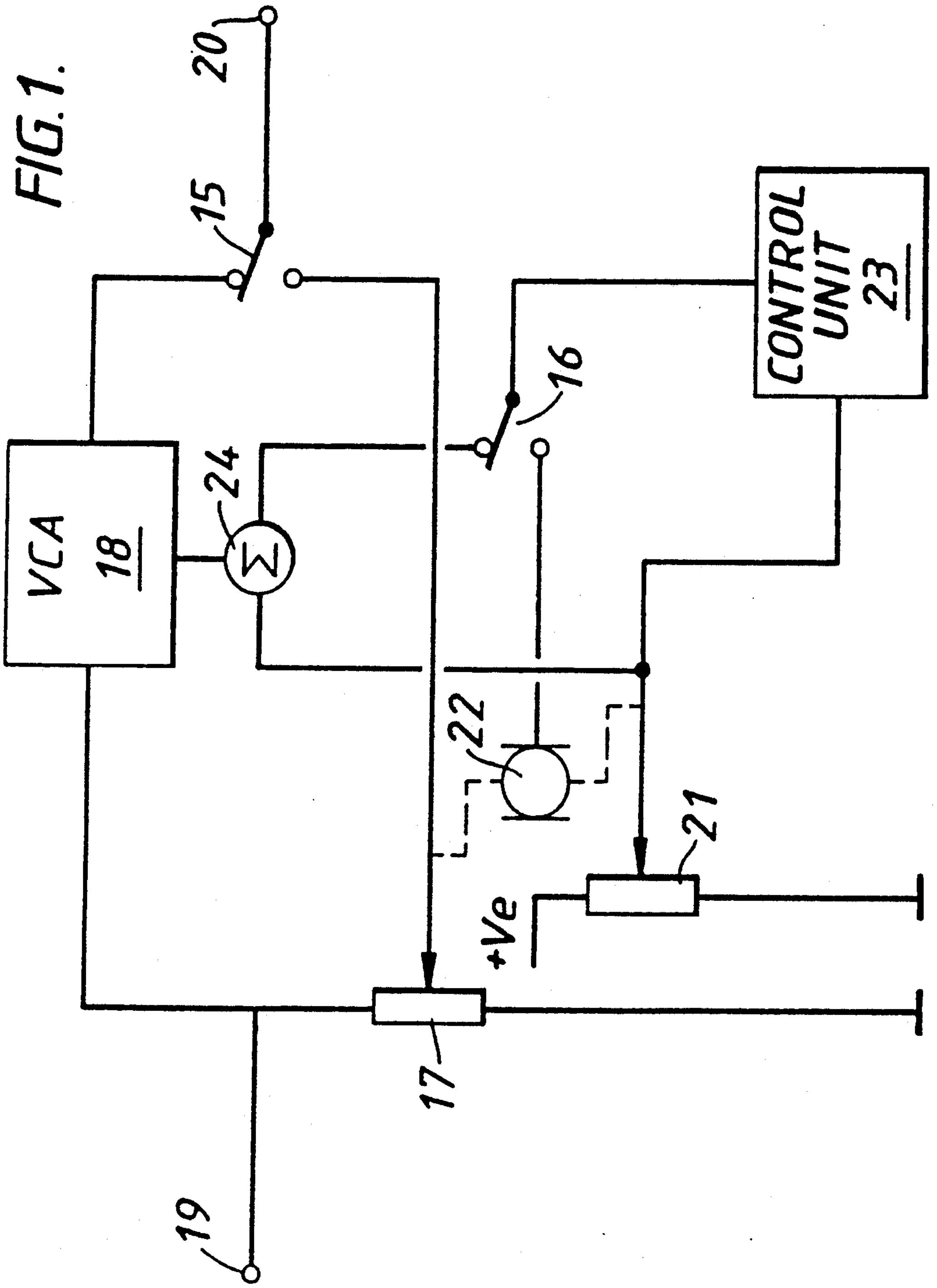
FIG. 1 is a circuit diagram of an output control apparatus, with switchable means for operating between a first mode of operation and a second mode of operation and means for storing data indicative of said movements of said manually operable element over the duration of the audio event; and, FIG. 2 shows a graph of fader attenuation against time over the duration of an audio event.

The circuit shown at FIG. 1 includes two switches, identified by the references 15 and 16, which are operated simultaneously, preferably under the control of a computer, to effect changes between operation in a first mode and operation in a second mode. In the first mode of operation, the level of an audio signal is controlled via a resistive element configured as a potentionmeter 17 and in said second mode the output level is controlled by means of a voltage controlled amplifier 18.

The first mode of operation is the normal mode, which ensures that the signal undergoes minimum distortion because the level is controlled by means of the resistive element 17. The first mode of operation is selected by placing switches 15 and 16 into the alternative position to that shown in FIG. 1, that is into the down position. An audio input signal is supplied to the potentiometer 17 via a input port 19 and a tap from said potentiometer 17 supplies the attenuated audio signal to an output port 20 via switch 15. The potentiometer 17 forms part of a sub-assembly, comprising, in addition to said potentiometer 17, and additional potentiometer 21 and a motor drive 22 for effecting movement of said potentiometers in response to a control signal. Said sub-assembly is commonly referred to as a motorised fader, in which manual adjustment is made by means of a fader control, arranged to move in a linear fashion.

The additional potentiometer 21, ganged with potentiometer 17, is connected to a control voltage, such that a proportion of said voltage is supplied to a control unit 23, which varies with the manual adjustments of potentiometer 17. The voltage supplied to control unit 23 is digitised and stored in said unit 23, such that, over the duration of an audio event, data, indicative of all manual movements made by the fader, may be recorded. On repeating said audio event, the recorded data may be read from the control unit 23, converted to provide a motor drive signal and supplied to said motor drive 22 via switch 16. Thus, in response to the recorded data, potentiometer 17 may be adjusted automatically over the audio event, following the previously recorded motions of the system operator.

Figure 2:
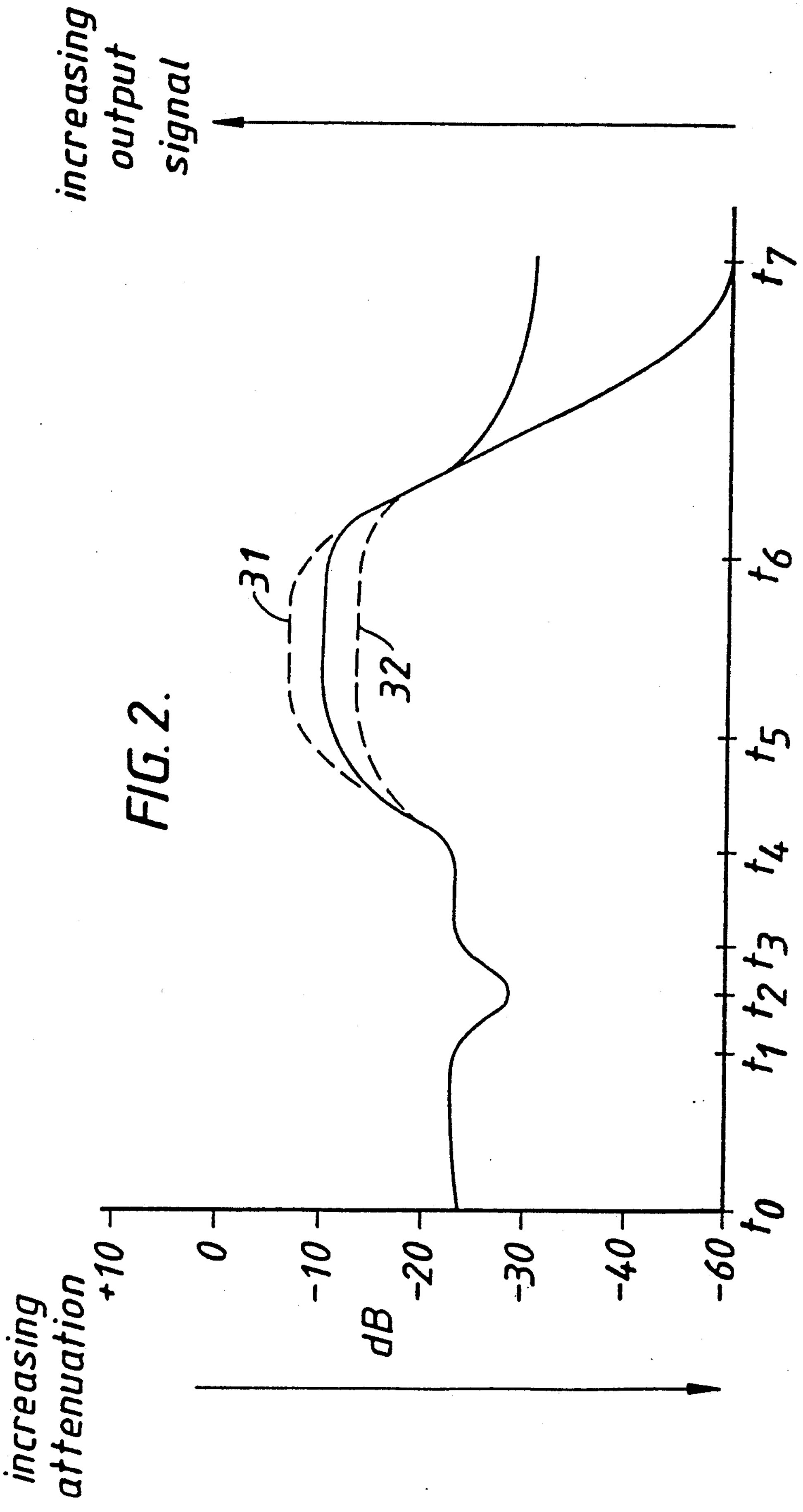

Variations in attenuation, as selected by an operating engineer, are shown graphically in FIG. 2, for the duration of an audio event over the period $t_0$ to $t_7$. At time $t_1$, the attenuation is increased and then at time $t_2$ it is decreased, so that by time $t_3$ it has returned to its original position. At time $t_4$ the attentuation is decreased until time $t_5$, whereafter it remains constant until time $t_6$, and then it is increased to the maximum degree of attenuation at time $t_7$. The data, illustrated graphically in FIG. 2, is stored digitally by the control unit 23, during operation of the circuit shown in FIG. 1 in said first mode. The audio event may now be repeated, to allow the operator to review the variations in attenuation that he has recorded and the output level will be controlled automatically by the potentiometer 18, under the control of the motor drive 22.

For the purposes of this illustration, it will now be assumed that the operator is not entirely content with the response recorded over the period $t_5$ to $t_6$ and that he would like to experiment with increasing and decreasing the level of the signal over this period, possibly with the intention of achieving a more dramatic effect, while, at the same time, not wishing to introduce distortion, say, by overloading the overall output level. First of all, he decides to increase the level that is reduce attenuation, over the period $t_5$ to $t_6$ and, by means of a suitable instruction, switches 15 and 16 are placed into the orientation shown in FIG. 1; thus selecting the second mode of operation.

In the second mode of operation, the audio input signal is supplied to the input of a voltage controlled amplifier 18 via input port 19. The level of the signal supplied to the output port 20, via switch 15, is adjusted by the voltage controlled amplifier 18, in response to a control signal received from a combiner 24. The combiner 24 receives an analog representation of the stored position data from the control unit 23 via switch 16, said switch ensuring that said signal is not supplied to the motor drive 22. Thus, signal level is controlled in response to the stored data, in a similar way to which it is controlled via potentiometer 17, under the first mode of operation. However, in the second mode of operation, manual adjustments to the fader may be made given that, in addition to providing a signal to the control unit 23, the additional potentiometer 21 also provides a signal, indicative of the position of the fader 17, to the combiner 24. Thus, on repeating the audio event, the engineer may adjust the fader at time $t_4$, such that the voltage controlled amplifier 18 receives a control signal which derives a contribution from both the potentiometer 21 and the control unit 23; an effect which is illustrated by a dotted line 31 in FIG. 2. Thus, the offset voltage supplied to the combiner 24 allows the system to operate in the aforesaid "trim mode" while, at the same time, the voltage generated by the additional potentiometer 21 is also supplied to the control unit, so that it may be combined with the originally generated data.

For the purposes of this illustration, it is now assumed that the operator has decided that his modification actually makes the final production worse, rather than better, and he has, therefore, decided to increase the attenuation over the period $t_4$ to $t_6$, as illustrated by the dotted response 32. Again, the engineer enters the second mode of operation and a manual adjustment is made to the fader, this time increasing attenuation, over the period $t_5$ to $t_6$. Again, the newly created data, generated by movement of fader 17, combine with the originally recorded data and, on entering the first mode of operation, the level is adjusted in accordance with response 32.

The circuit shown in FIG. 1 allows "trim mode" operation to be effected, while employing high fidelity resistive control means, by making temporary use of a voltage controlled amplifier while performing the trimming operaiton. In this way, the operator can hear the effect of a trim while he is actually doing it, thereby enabling said operator to achieve the desired result with the minimum number of repetitions. Once the differential data generated by the trimming operation has been derived, said data is combined with the original data, allowing further operations to be effected without the voltage controlled amplifier. It should be noted that the motorised fader is a highly engineered piece of equipment and comprises a major proportion of the total cost of the system. Consequently, the provision of circuitry to provide the trim function does not add, significantly, to the overall cost of the system while, in accordance with the present invention, it provides substantial advantages to a professional operator.

In a modified embodiment incremented trimming may be performed in which, on entering the second mode, the sensitivity of the resistive fader is changed. Thus, full movement of the fader in the first mode may represent a gain of between minus 60 to plus 10, positive gain being provided by amplification devices not shown in FIG. 1. However, on entering trim mode, the full range of the manual fader 17 may provide a 10 dB trim window on either side of the previously stored value. Thus, incremental trimming allows very precise adjustments to be made to the recordal values. The sensitivity of the voltage controlled amplifier 18 to manual operation of the fader 17 may be controlled by the control unit 23 and adjusted in response to manual commands from the operator.

What we claim is:

1. A method of controlling the output level of an audio signal comprising the steps of:

supplying an audio input signal through a resistive control element (18);

manually adjusting the resistance of said control element over the duration of an audio event;

recording data indicative of said adjustment;

repeating said audio event, while automatically adjusting the resistance of said control element in response to said data;

selecting an alternative mode of operation in which said input signal is supplied to a variable gain device;

adjusting the gain of said device in response to said data; and, simultaneously, adjusting the gain of said device in response to manual adjustments to said control element.

2. A method according to claim 1, wherein variations in the gain of said variable gain device in said second mode of opertion are arranged to provide a substantially similar response to resistance adjustments in said first mode.

3. A method according to claim 1, wherein variations in the gain of said variable gain device in said second mode provide a different response to resistive adjustments in said first mode.

4. A method according to claim 3, wherein variations in gain during the second mode facilitate incremental adjustment in which the full movement of said control element in the second mode is equivalent to only a portion of its movement in the first mode of operation.

5. A method according to claim 1, including recording data indicative of said adjustments digitally.

6. A method according to claim 1, including automatically adjusting said control element via a motorised device.

7. A method according to claim 1, including storing an indication of said manual adjustments during said second mode of operation.

8. A method according to claim 1, including combining original data with said modified data to produce new data.

9. Apparatus for controlling the output level of an audio signal, comprising:

a resistive control element;

means for manually adjusting said control element and driven means for adjusting said element;

means for recording position data indicative of manually selected positions of said element;

variable gain means for controlling the output level of the audio signal, on selection of a second mode of operation, in response to said position data;

means for simultaneously controlling said variable gain means in response to manual operation of said element; and, means for recording position data indicative of the position of said manual element during said second mode of operation.

10. Apparatus according to claim 9, wherein said resistive control element is a motorised fader.

11. Apparatus according to claim 9, wherein said means for recording position data is a digital processing and storage device.

12. Apparatus according to claim 9, including means for adjusting the sensitivity of said variable gain means, to provide incremental adjustment of the recorded data during said second mode of operation.

* * * * *